(12) United States Patent
Wang et al.

(10) Patent No.: US 6,229,726 B1
(45) Date of Patent: May 8, 2001

(54) INTEGRATED CIRCUIT CHIP HAVING MULTIPLE PACKAGE OPTIONS

(75) Inventors: Gyh-Bin Wang, Chung-Li; Chih-Tung Wang, Long-tan; Tah-Kang Joseph Ting, Hsinchu, all of (TW)

(73) Assignee: Etron Technology, Inc., Hsin-Chu (TW)

( * ) Notice: Subject to any disclaimer, the term of this patent is extended or adjusted under 35 U.S.C. 154(b) by 0 days.

(21) Appl. No.: 09/498,742

(22) Filed: Feb. 7, 2000

(51) Int. Cl.[7] .................................................. G11C 5/02
(52) U.S. Cl. .............................................. 365/51; 365/212
(58) Field of Search ................................. 365/51, 63, 208, 365/49, 212

(56) References Cited

U.S. PATENT DOCUMENTS

| | | | |
|---|---|---|---|
| 5,691,949 | * 11/1997 | Hively et al. | 365/230.03 |
| 5,781,488 | 7/1998 | Liu et al. | 365/207 |
| 5,843,809 | * 12/1998 | Rostoker | 438/123 |
| 5,867,417 | * 2/1999 | Wallace et al. | 365/52 |
| 5,914,530 | 6/1999 | Murakami et al. | 257/666 |
| 5,936,876 | * 8/1999 | Sugasawara | 365/51 |
| 5,943,254 | * 8/1999 | Bakeman, Jr. et al. | 365/72 |

* cited by examiner

Primary Examiner—David Nelms
Assistant Examiner—Thong Le

(74) Attorney, Agent, or Firm—George O. Saile; Stephen B. Ackerman; Billy J. Knowles

(57) ABSTRACT

An integrated circuit formed on a semiconductor substrate having multiple input/output signal paths such that the semiconductor substrate can be mounted to more than one package type. The integrated circuit formed on the semiconductor substrate has at least three pluralities of input output connector pads. The first plurality of input/output connector pads is placed on the semiconductor substrate and is attached to a first functional circuit of the integrated circuit. The second and third pluralities of input/output connector pads are placed on the semiconductor substrate and are attached to a second functional circuit of the integrated circuit. The third plurality of input/output connector pads is placed in an area separated from the first and second pluralities of input/output connector pads. Each input/output connector pads of the third plurality of input/output connector pads is connected to a corresponding input/output connector pad of the second plurality of input/output connector pads and thus to the second functional circuit. If the semiconductor substrate is mounted in a first package type, the second plurality of input/output connector pads is bonded to pins of the first package type to connect the second functional circuit to the external circuit, and the third plurality of input/output connector pads remain unbonded. If the semiconductor substrate is mounted in a second package type, the third plurality of input/output connector pads is bonded to pins of the second package type to connect the second functional circuit to the external circuit and the second plurality of input/output connector pads remain unbonded.

30 Claims, 12 Drawing Sheets

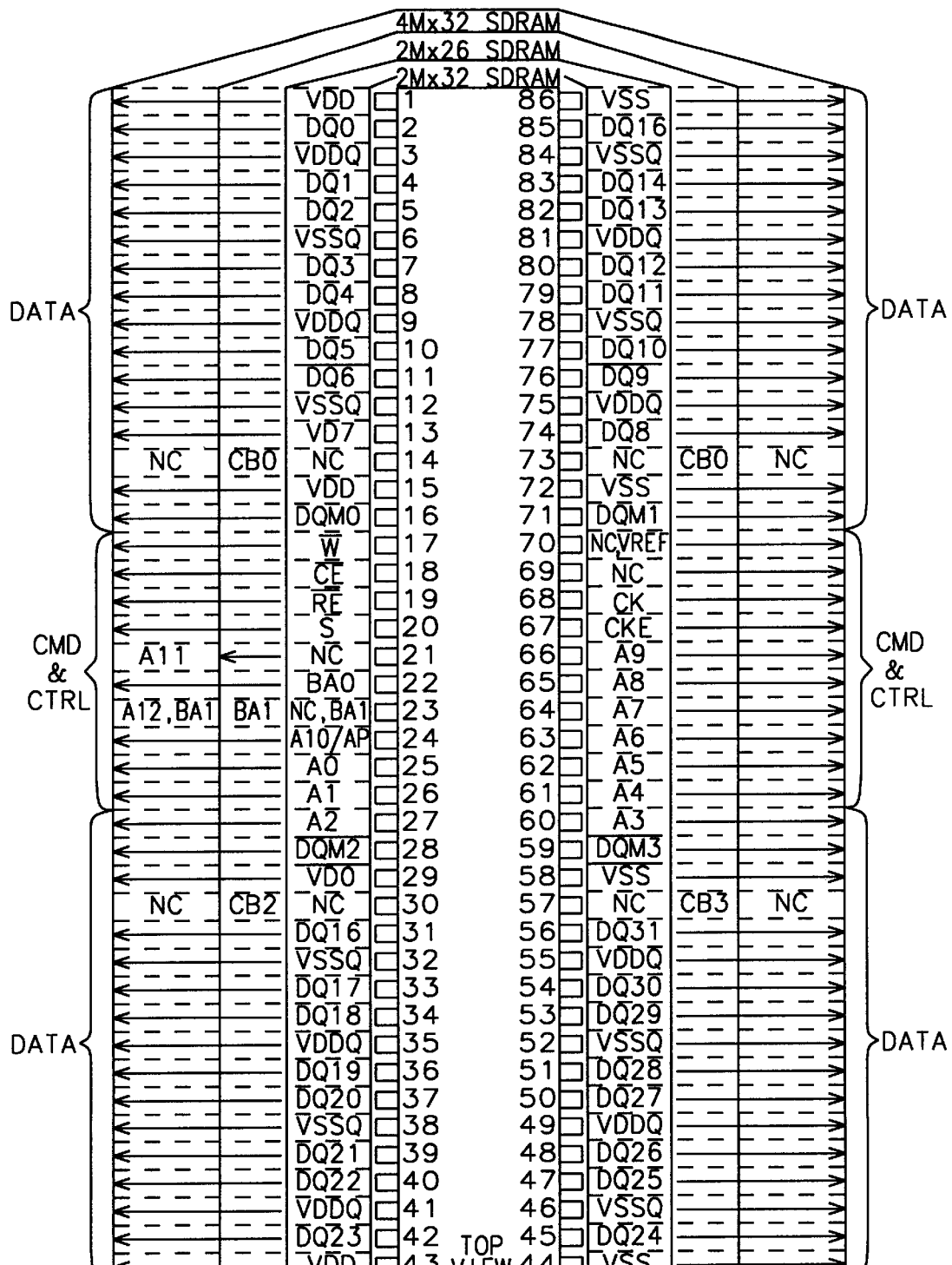
FIG. 1a – Prior Art

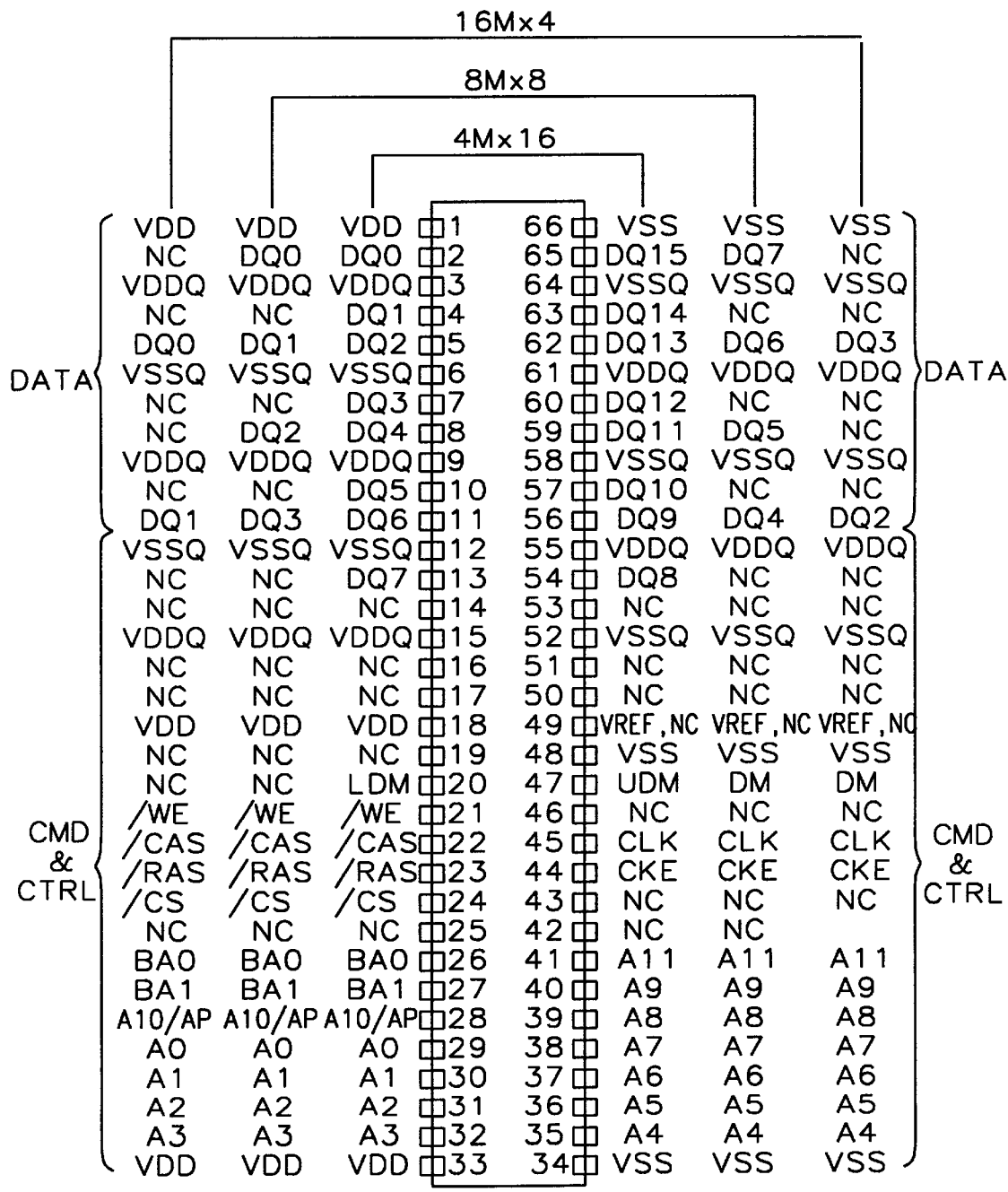
FIG. 1b — Prior Art

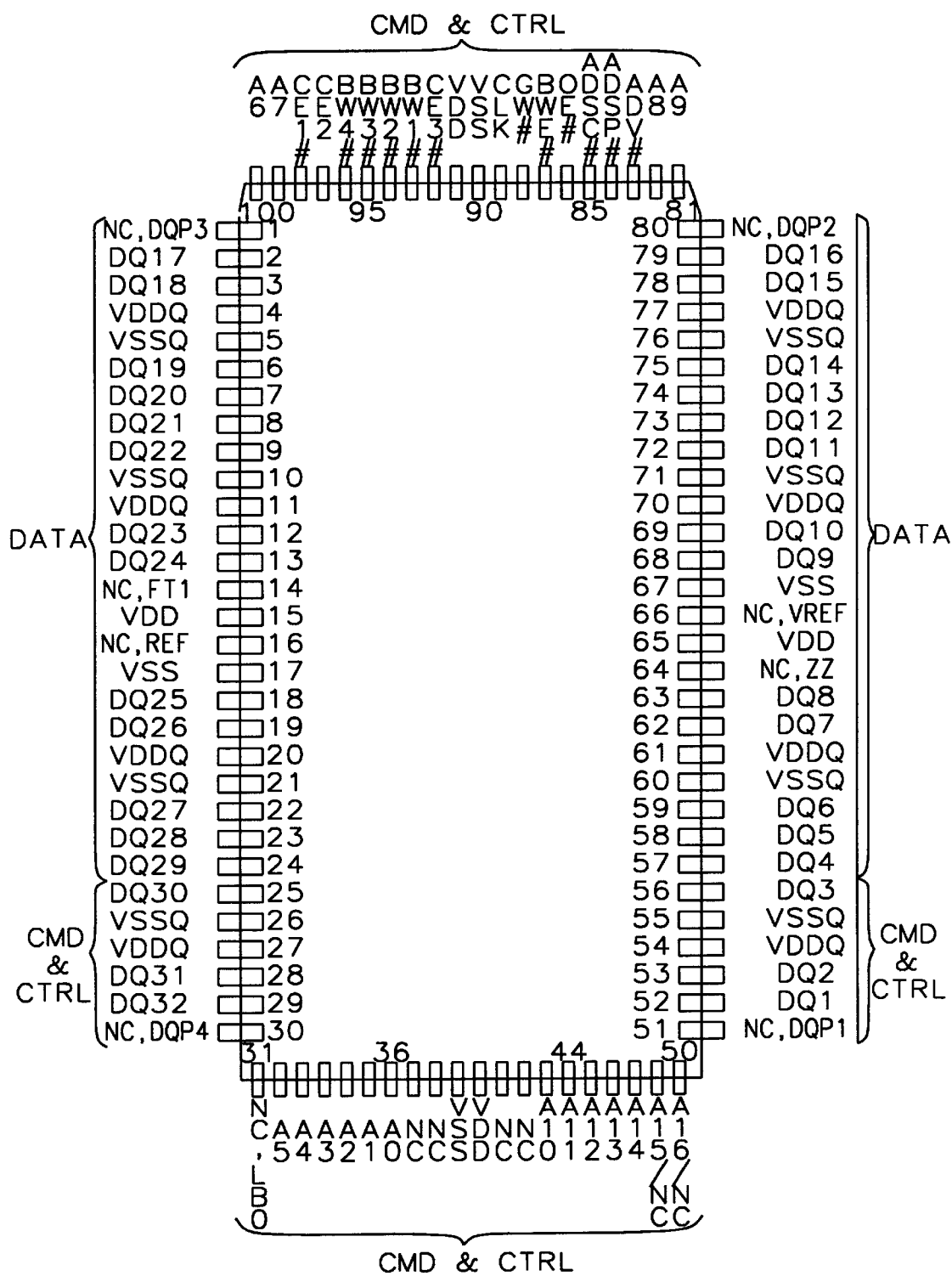
FIG. 2b – Prior Art

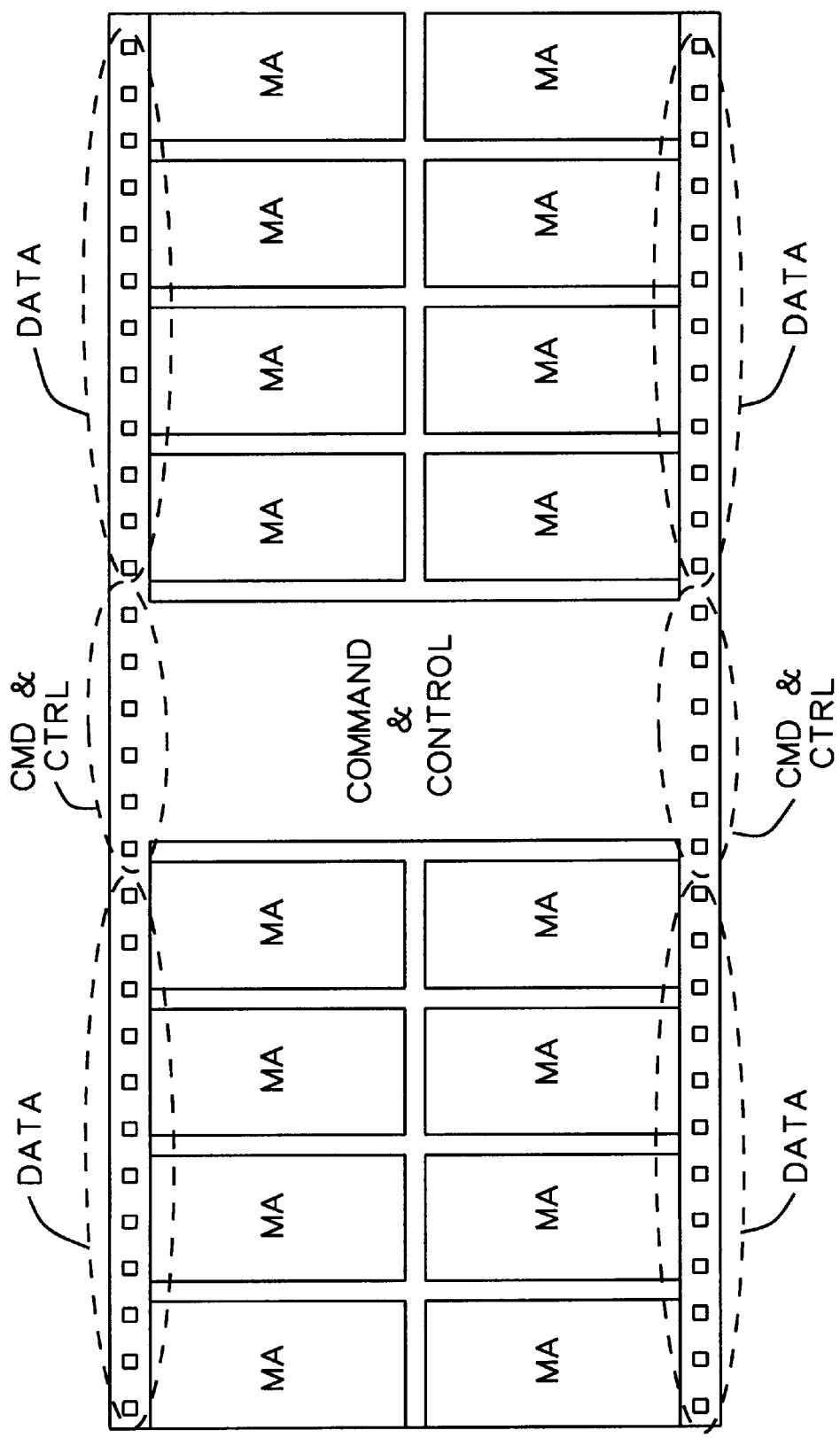
FIG. 3a – Prior Art

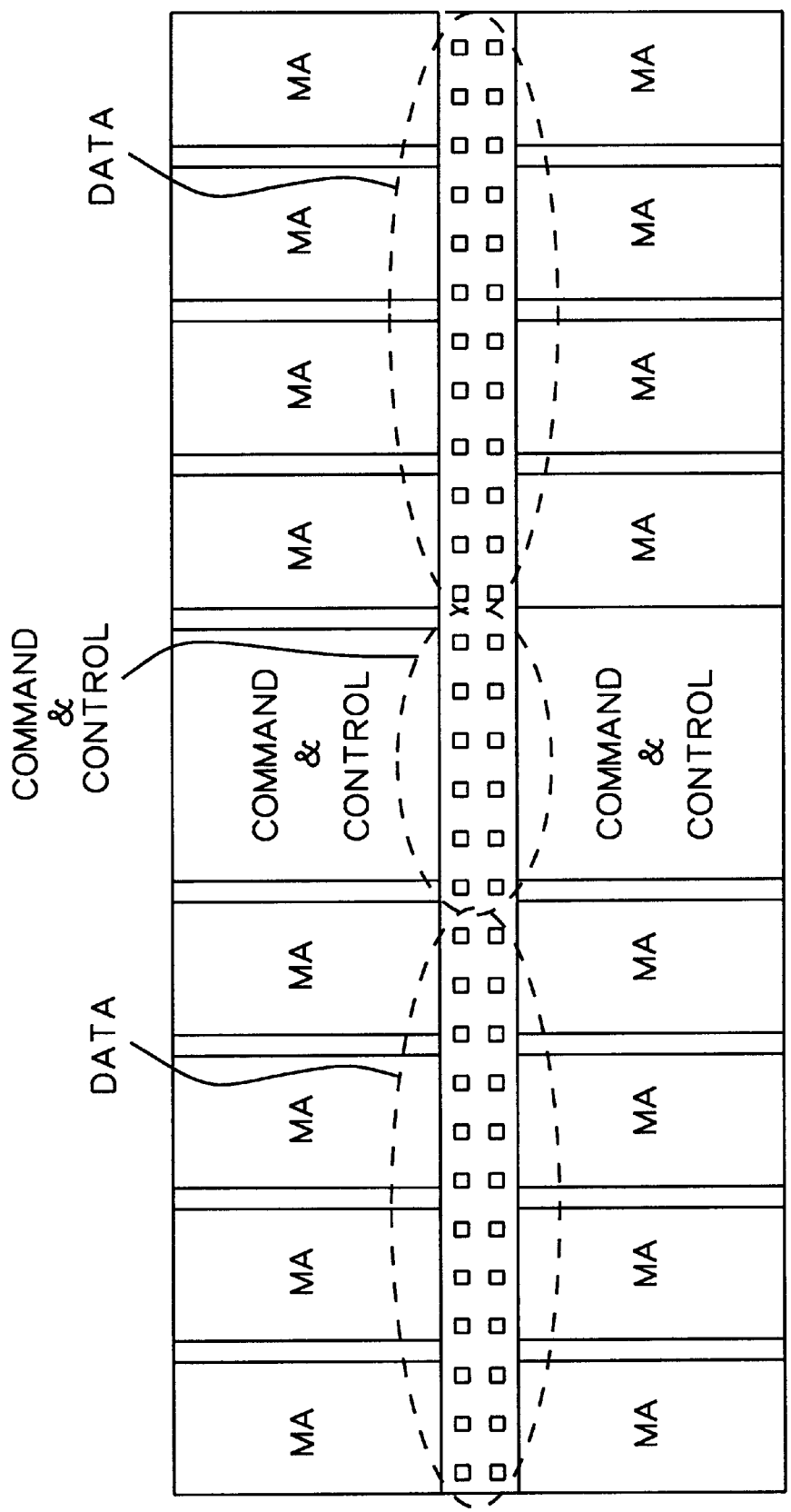
FIG. 3b – Prior Art

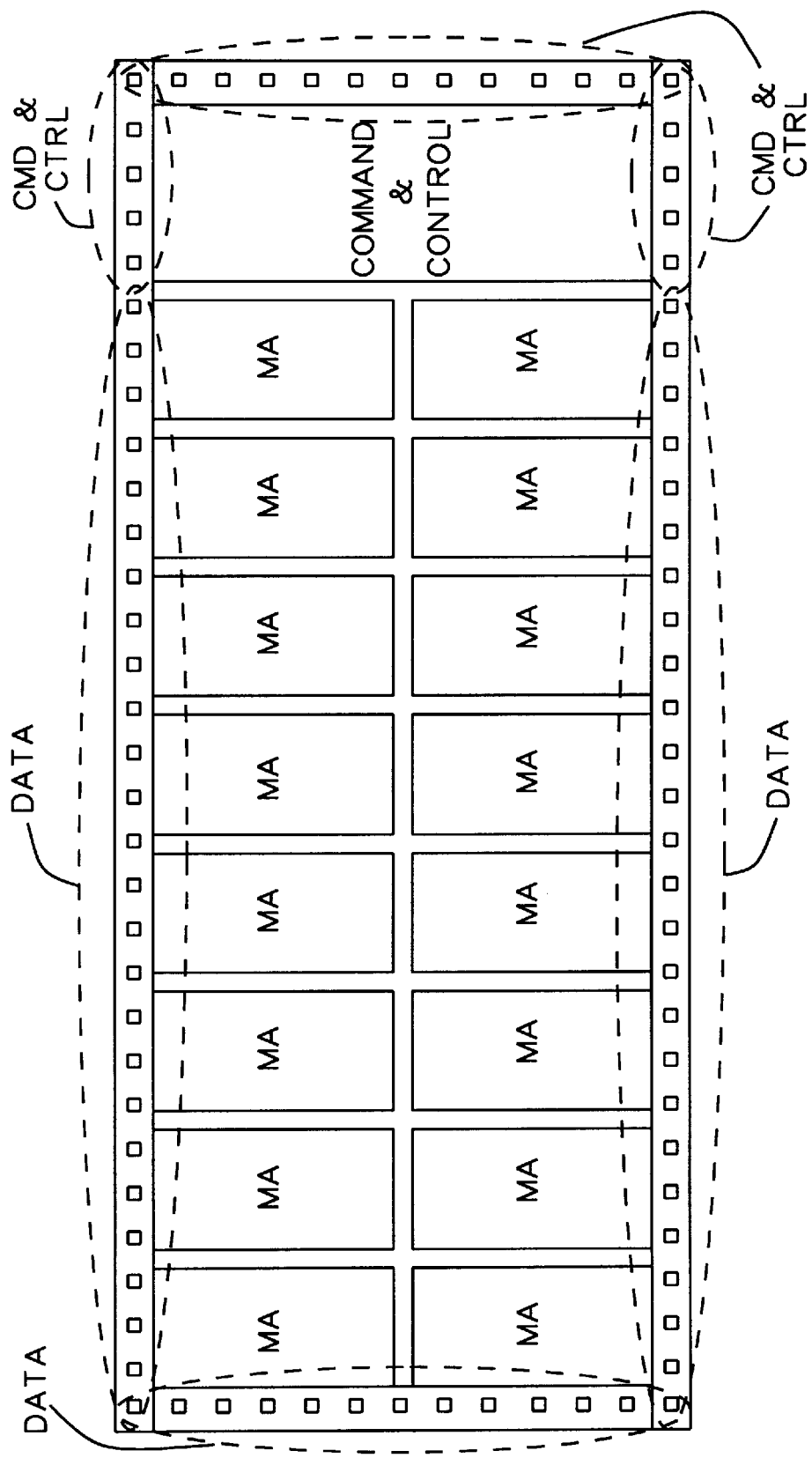
FIG. 4a – Prior Art

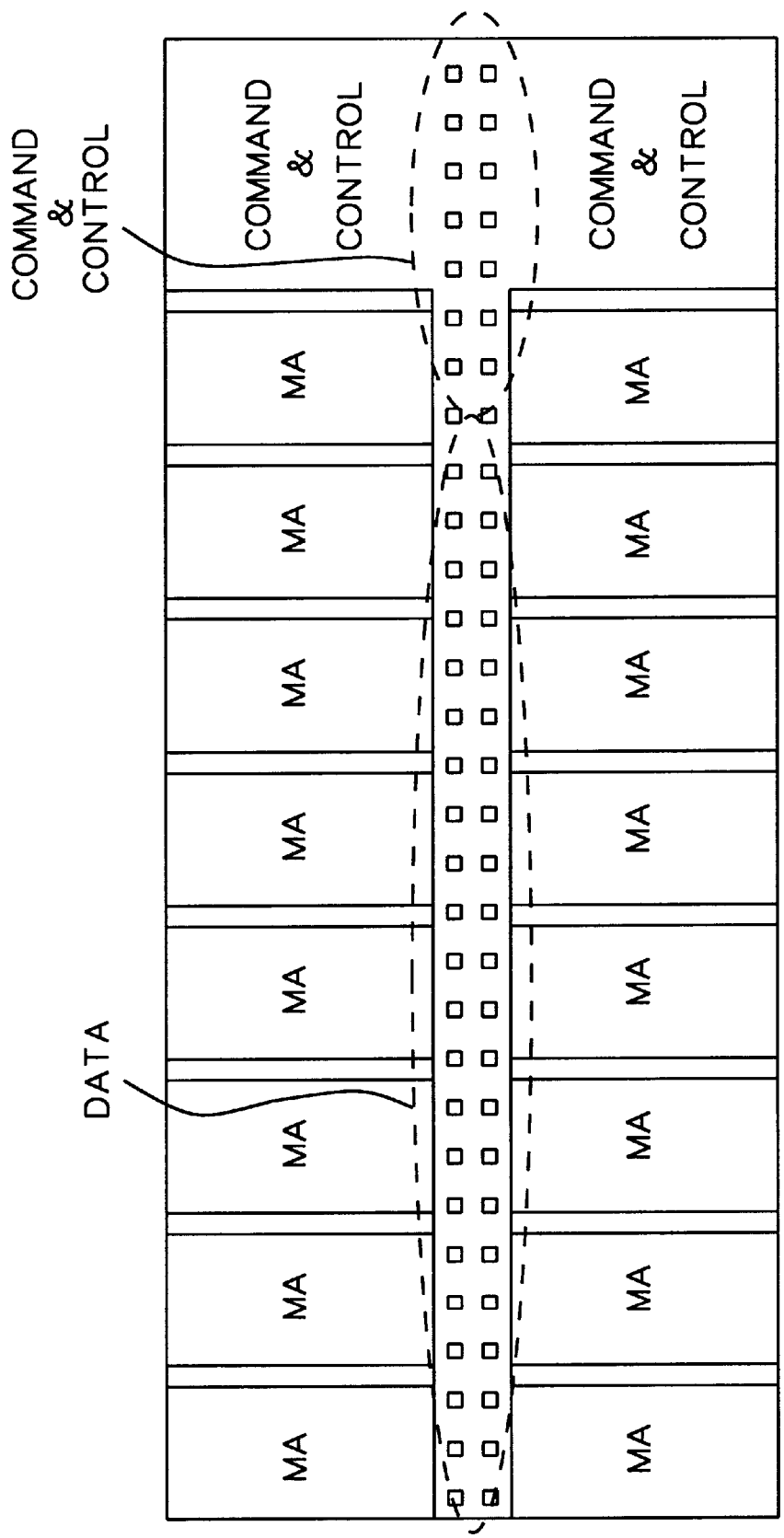
FIG. 4b – Prior Art

INTEGRATED CIRCUIT CHIP HAVING MULTIPLE PACKAGE OPTIONS

BACKGROUND OF THE INVENTION

1. Field of the Invention

This invention is related to integrated circuits. More particularly, this invention relates to integrated circuit chips capable of having multiple packaging options.

2. Description of the Related Art

The Joint Electron Device Engineering Council (JEDEC) of the Electronic Industries Alliance (EIA) creates the semiconductor engineering standards for integrated circuits. The JEDEC standard No. 21-C defines the engineering specifications for solid state memories. The specifications include the electrical operating parameters and the physical packaging for the semiconductor memories that are generally available in the industry. A particular type of random access memory (RAM) may have multiple packaging options as shown in FIGS. 1a, 1b, 2a and 2b. FIG. 1a illustrates a 64M bit synchronous dynamic RAM (SDRAM) as shown in the JEDEC standard 21-C page 3.11.4–13; FIG. 1b illustrates an equivalent 64M bit SDRAM as shown in the JEDEC standard 21-C page 3.11.2–12 and FIG. 2a illustrates an equivalent 64M bit SDRAM as shown in the JEDEC standard 21-C page 3.11.4–4. FIG. 2b illustrates a 32K×32 Burst Static RAM (BSRAM) as shown in JEDEC standard 21-C page 3.7.8–5. In FIGS. 1a and 1b, the 64M bit SDRAM is packaged respectively in an 86 pin thin small outline package (TSOP) and a 66 pin TSOP and in FIG. 2a the 64M bit is packaged in a 100 pin thin profile plastic quad flat package (TQFP). In FIG. 2b a 32K×32 BSRAM is packaged in a 100 pin TQFP. As the size of the semiconductor memory chips has increased with time, the physical size of the semiconductor substrate has approached the physical size of the package. This has forced the input/output connection pads of the semiconductor memory to be connected directly to the pins of the package that are in closest proximity.

Refer now to FIGS. 3a and 3b for a view of the top surface of an SDRAM. The arrays of memory cells (MA) are placed at each end of the semiconductor substrate and the command and control circuitry is placed centrally on the semiconductor substrate. The command and control circuitry accepts the address signals, the clock signals, the row address strobe, the column address strobe, and the write/read command from external circuitry. The command and control circuitry generates the signals necessary to write data to or read data from the desired memory cells of the memory arrays.

The input/output connection pads are placed as near as possible to the functions for which the signals they are to conduct are located. For instance, the data (DQ) input/output connection pads are placed near the array of memory cells and the command and control input/output connection pads are placed near the command and control circuitry. Placing the input/output connection pads as close as possible to the circuitry that employs the signals present on the connection minimizes wiring complexity and attendant crosstalk and noise problems.

The physical structure of the circuit and the placement of the input/output connection pads is a design decision made by the manufacturer of a particular chip. In FIG. 3a, the input/output connection pads are placed at two peripheral edges of the SDRAM. While, in FIG. 3b, the input/output connection pads are placed about a central axis of the SDRAM. The placement of the data input/output (DQ) connection pads and the command and control input/output connection pads in the TSOP package of FIG. 1a or the TQFP package of FIG. 2b. This structure is termed in the art as an outer data/inner control package (ODIC). That is the data input/output pins are at the end regions of the TSOP package and the command and control input/output pins are centrally located on the edges of the TSOP or TQFP package.

FIGS. 4a and 4b illustrate top views of an SDRAM substrate, in which the command and control circuitry is placed at one edge of the semiconductor substrate, while the memory arrays (MA) occupy the remaining area of the semiconductor substrate.

The command and control input/output connection pads are now best placed at the edges of the semiconductor substrate nearest the command and control circuitry. Likewise, the data input/output (DQ) connection pads are placed along the remaining edges of the semiconductor substrate nearest the memory arrays.

This particular structure is best suited to fit the TSOP of FIG. 1b or TQFP package shown in FIG. 2a. The command and control input/output connection pads are bonded to the closest input/output pins of the TSOP of FIG. 1b or TQFP package shown in FIG. 2a. In this case, the command and control input/output pins are now at one end of the TSOP of FIG. 1b or TQFP package shown in FIG. 2a. The data input/output (DQ) connection pads are bonded to the closest input/output pins of the TSOP of FIG. 1b or TQFP package shown in FIG. 2a. The data input/output pins are at the remaining edges of the TSOP of FIG. 1b or TQFP package shown in FIG. 2a. This structure is termed in the art as a non-outer data inner control package (non-ODIC).

Any manufacturer of the RAM desiring to provide each of the two package styles, the TSOP and TQFP package, must have two separate RAM integrated circuit designs to fulfill demand for both styles.

U.S. Pat. No. 5,914,530 (Murakami et at.) describes an integrated circuit chip similar to that described in FIG. 3b and mounted in a TSOP package somewhat similar to that of FIG. 1. Murakami et al. further describes the placement and structure of the lead frame and the bonding from the lead frame to the semiconductor substrate.

U.S. Pat. No. 5,781,488 (Lia et al.) describes a DRAM having a staggered bit-line sense amplifier configuration. The stagger bit-line sense amplifier uses an input/output path that minimizes time delay through the input/output data path.

U.S. Pat. No. 5,843,809 (Rostoker) describes a lead frame structure for DRAM's employing trench capacitors. Rostoker illustrates the use of a lead frame using one or more Y-shaped leads, which branch in the direction of different input/output connection pins. This allows one of the module pins to connect to multiple widely spaced input/output connection pads. The lead frame is designed to be used in a dual-in-line package (DIP) with semiconductor substrates having input/output connection pads placed on the central axis of the substrate as shown in FIG. 3b.

SUMMARY OF THE INVENTION

An object of this invention is to provide an integrated circuit formed on a semiconductor substrate that can be mounted to more than one package type.

Another object of this invention is to provide multiple input/output signal paths from an integrated circuit formed on a semiconductor substrate to allow the integrated circuit to be mounted in any one of the multiple package types.

To accomplish these and other objects, an integrated circuit formed on a semiconductor substrate has at least three plurality of input output connector pads. The first plurality of input/output connector pads is placed on the semiconductor substrate and is attached to a first functional circuit of the integrated circuit. The second plurality of input/output connector pads is placed on the semiconductor substrate and is attached to a second functional circuit of the integrated circuit. In addition, the third plurality of input/output connector pads is placed on the semiconductor substrate in an area separated from the first and second pluralities of input/output connector pads. Each input/output connector pads of the third plurality of input/output connector pads is connected to a corresponding input/output connector pad of the second plurality of input/output connector pads and thus to the second functional circuit. If the semiconductor substrate is mounted in a first package type, the second plurality of input/output connector pads is bonded to pins of the first package type to connect the second functional circuit to the external circuit, and the third plurality of input/output connector pads remain unbonded and thus disconnected from the first package type. However, if the semiconductor substrate is mounted in a second package type, the third plurality of input/output connector pads is bonded to pins of the second package type to connect the second functional circuit to the external circuit and the second plurality of input/output connector pads remain unbonded and thus disconnected from the first package type.

In the preferred embodiment, the first functional circuit is at least one array of memory cells and the second functional circuit provides address, control, timing, and command signals to the array of memory cells. The memory cells maybe static random access memory cells, read only memory cells, dynamic random access memory cells, synchronous dynamic random access memory cells, or graphic random access memory cells.

The second plurality of input/output connector pads are placed centrally on the semiconductor substrate to allow connection as outer data inner control on the first package type. Alternately, the third plurality of input/output connector pads are placed in proximity to a peripheral edge of semiconductor substrate to allow connection as non-outer data inner control on the second package type.

The integrated circuit may further comprise a first plurality of switching circuits. Each switching circuit is connected between one of the third plurality of input/output connector pads and the second functional circuit and in close proximity to the second functional circuit to disconnect the third input/output connector pads from the second functional circuit. The integrated circuit may also be further comprising a second plurality of switching circuits. Each switching circuit is connected between one of the second plurality of input/output connector pads and the second functional circuit and in close proximity to the second functional circuit to disconnect the second input/output connector pads from the second functional circuit.

A first plurality of input/output sub circuits of the second functional circuit may be placed in close proximity to the second plurality of input/output connector pads such that each input/output subcircuit is connected to one of the second plurality of input/output connector pads. Additionally, a second plurality of input/output sub circuits of the second functional circuit is placed in close proximity to the third plurality of input/output connector pads such that each input/output subcircuit is connected to one of the third plurality of input/output connector pads. The first plurality of input/output subcircuits are activated and the second plurality of input/output subcircuits are not activated if the semiconductor substrate is mounted in the first package type. The second plurality of input/output subcircuits is activated and the first plurality of input/output subcircuits is not activated if the semiconductor substrate is mounted in said second package type.

BRIEF DESCRIPTION OF THE DRAWINGS

FIGS. 1a and 1b are diagrams of a 64M bit SDRAM packaged in a TSOP package as described in JEDEC standard 21-C of the prior art.

FIGS. 2a and 2b are respectively diagrams of a 64M bit SDRAM and a 32K×32 Burst SRAM packaged in a TQFP package as described in JEDEC standard 21-C of the prior art.

FIGS. 3a and 3b are diagrams of a memory structure showing input/output connection pad placement of the prior art.

FIGS. 4a and 4b are diagrams of a memory structure showing input/output connection pad placement of the prior art

DETAILED DESCRIPTION OF THE INVENTION

Figure 2A:
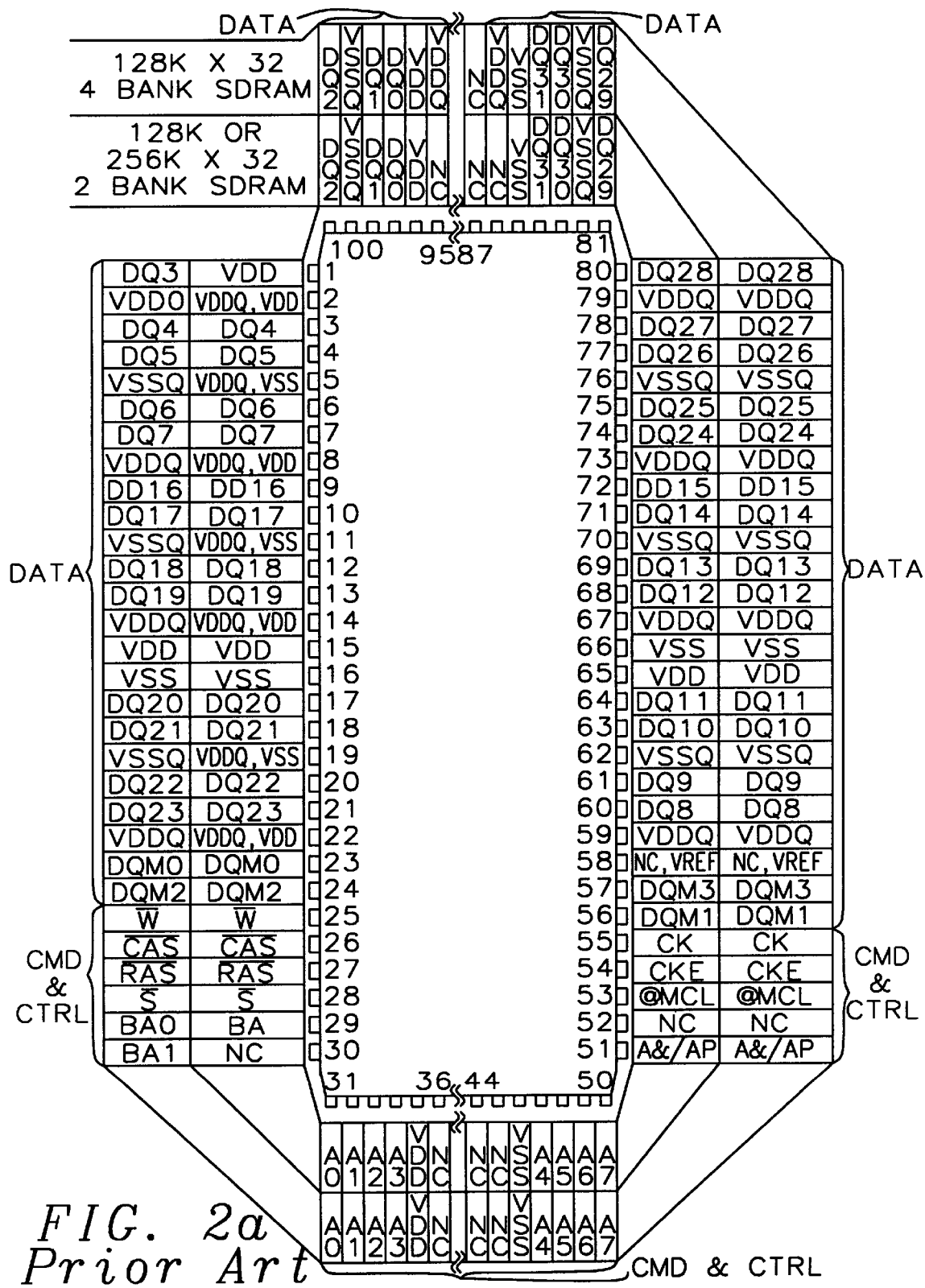

As a semiconductor technology matures , it is desirable for a manufacturer to provide as many of the options of a particular product as possible. For instance, as shown in FIGS. 1a, 1b, and 2a, a 64M bit SDRAM can be produced for either a TSOP package or a TQFP package as well as other package types approved under the JEDEC standard 21-C. To minimize the number of physical integrated circuit designs, this invention calls for an input/output connection pad structure where a function has two separate input/output connection pad areas. If the particular integrated circuit chip is to be mounted in one package type (i.e. TSOP), a first input/output connection pad area is bonded to the input/output pins of the first package and the second input/output connection pads have no bonding to the first package type. Alternately, if the integrated circuit chip is to be mounted in an alternate package type (i.e. TQFP), the second input/output connection pad area is bonded to the input/output pins of the alternate package type and the first input/output connection pads have no bonding to the alternate package.

Figure 5A:
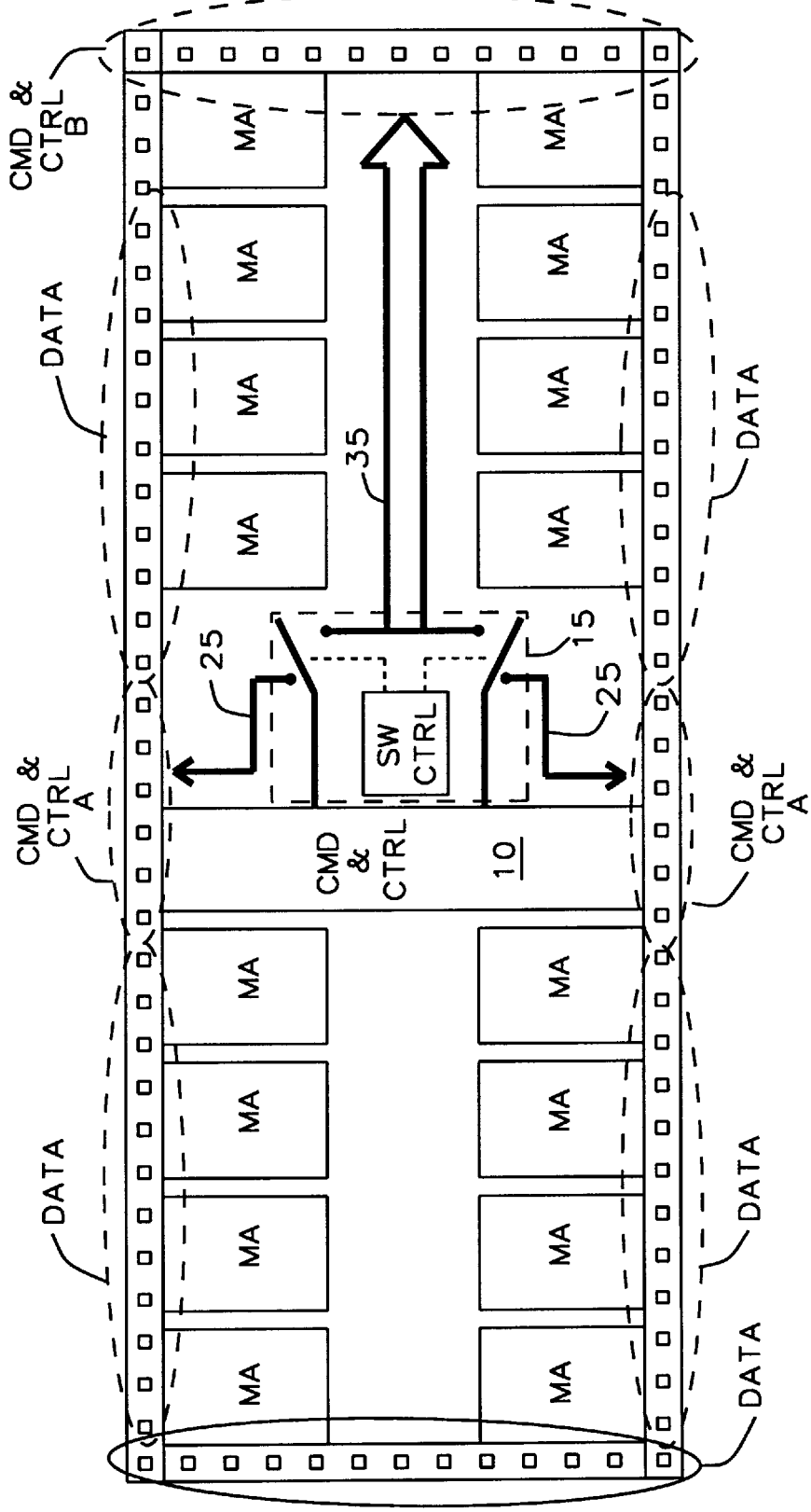
FIGS. 5a and 5b are diagrams of memory structures showing input/output connection pad placement of this invention.

Refer now to FIG. 5a to review the structure of a memory array having peripheral input/output connection pads for mounting in multiple packages. In this instance, the command and control circuitry is placed at one end of the semiconductor substrate and the memory array occupies the remaining area of the semiconductor substrate. The data input/output (DQ) connection pads are placed at the periphery of the semiconductor substrate near the memory arrays. There are two areas A and B of command and control input/output connection pads. The first area A is located centrally at the sides of the semiconductor substrate, and the second area B is located at one end of the semiconductor substrate. If the semiconductor substrate is mounted to an ODIC style package, the first area A of the command and control input/output connection pads is bonded to the corresponding input/output pins of the ODIC style package. The second area B of the command and control input/output connection pad is not bonded to any pins of the ODIC style package. This structure allows the memory array chip to be used as an outer data inner control configuration.

Alternately, if the semiconductor substrate is mounted in a non-ODIC style package, the second area B of the command and control input/output connection pads is bonded to the corresponding input/output pins of the non-ODIC style package. The first area A of the command and control input/output connection pads is not bonded to any pins of the non-ODIC style. This structure allows the memory array chip to be used as a non-outer data inner control configuration.

Figure 5B:
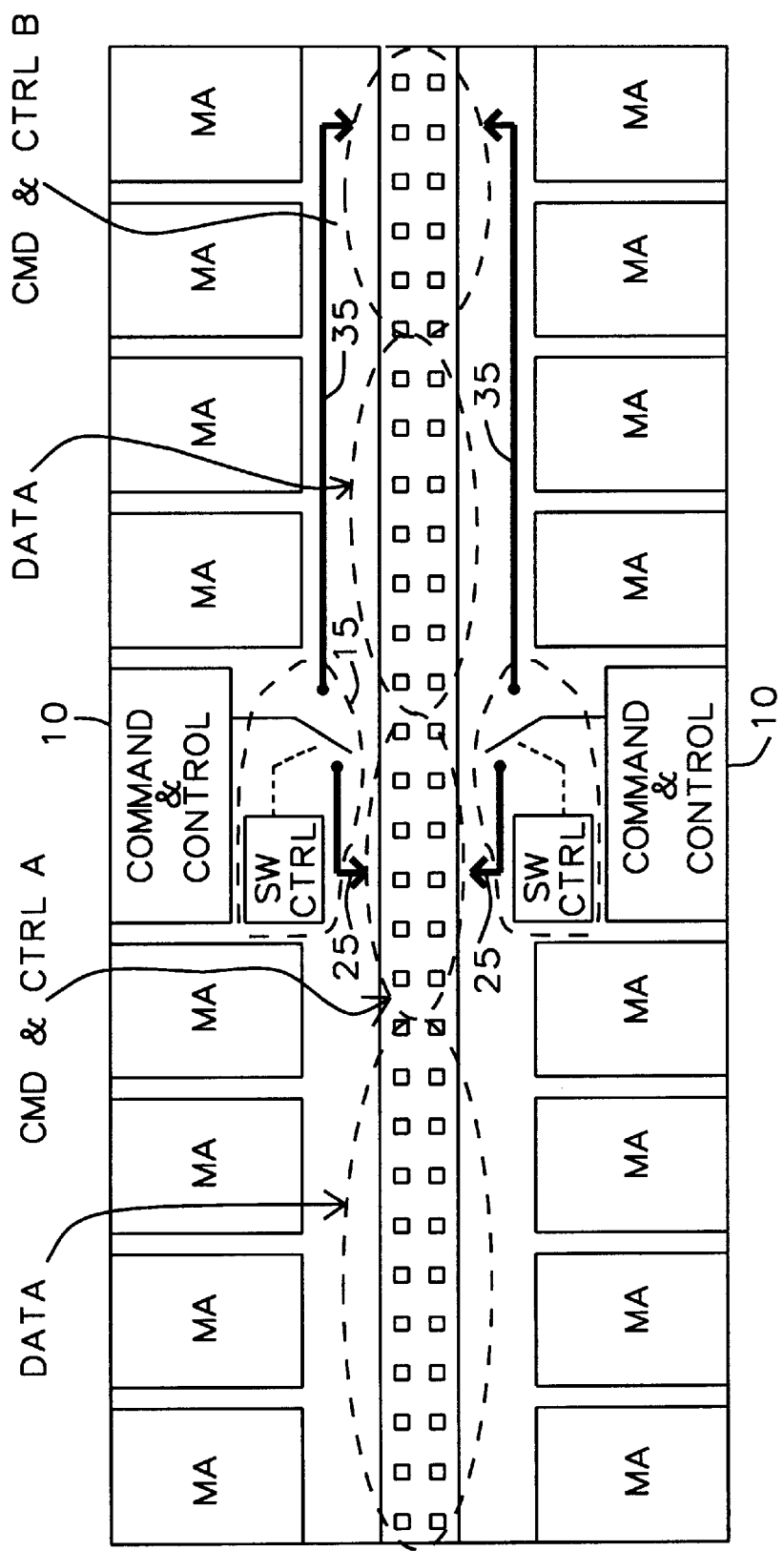

Refer now to FIG. 5b to review the structure of a memory array having input/output connection pads placed on the central axis of the semiconductor substrate for mounting in multiple packages. In this instance, the command and control circuitry is placed at one end of the semiconductor substrate and the memory array occupies the remaining area of the semiconductor substrate. The data input/output (DQ) connection pads are placed on the central axis of the semiconductor substrate near the memory arrays. There are two areas A and B of command and control input/output connection pads. The first area A is located centrally on the central axis of the semiconductor substrate, and the second area B is located at one end of the semiconductor substrate. If the semiconductor substrate is mounted to an ODIC style package, the first area A of the command and control input/output connection pads is bonded to the corresponding input/output pins of the ODIC style package. The second area B of the command and control input/output connection pads is not bonded to any pins of the ODIC style package. This structure allows the memory array chip to be used as an outer data inner control configuration.

Alternately, if the semiconductor substrate is mounted in a non-ODIC style package, the second area B of the command and control input/output connection pads are bonded to the corresponding input/output pins of the non-ODIC style package. The first area A of the command and control input/output connection pads is not bonded to any pins of the non-ODIC style. This structure allows the memory array chip to be used as a non-outer data inner control configuration.

Having multiple bonding configurations of a single integrated circuit design allows a single part designed for multiple packaged options.

Figure 6:
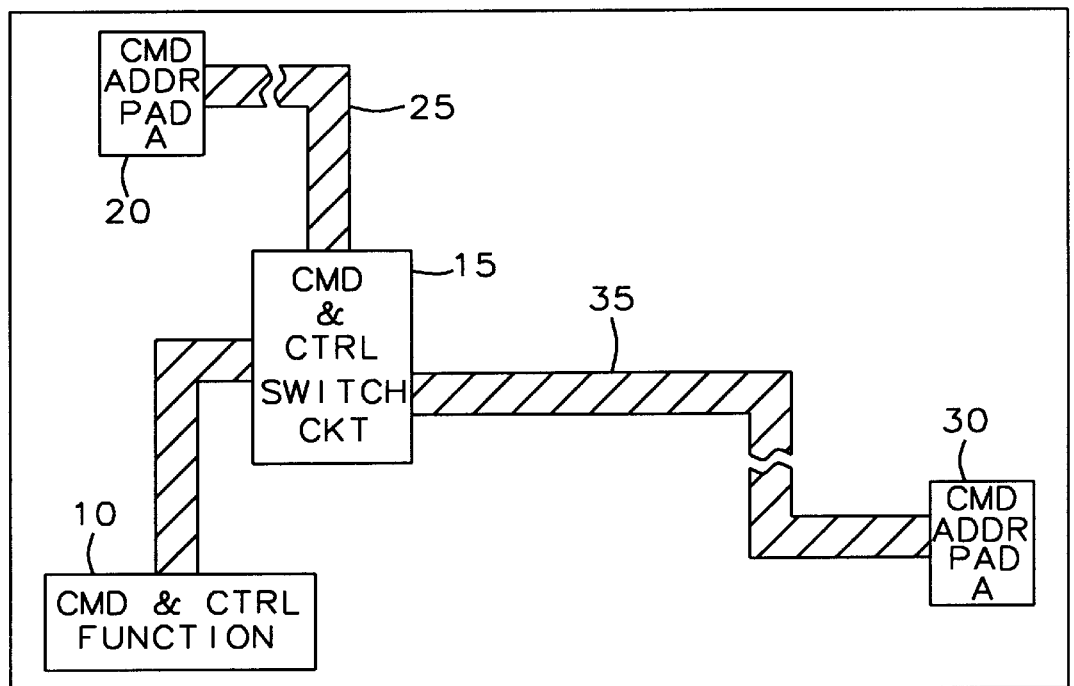
FIG. 6 is a diagram showing the input/output connection structure of this invention.

Refer now to FIGS. 5a, 5b, and 6 for a more detailed discussion of the integrated circuit design having multiple bonding options of this invention. The command and control functional circuit 10 is placed in a convenient area of the semiconductor substrate 5. A command and control input/output switch 15 is connected to the package functional circuit 10 to provide an interface to external circuitry. The command and control input/output switch 15 is connected by the metal interconnecting lands 35 to the input/output connection pad 20 that is located in the first area A. Also, the command and control input/output circuit 15 is connected by the metal interconnecting land 35 to the input/output connection pad 30 that is located in the second area B. If the semiconductor substrate 5 is mounted to a first package type such as the TSOP package of FIG. 1a or the TQFP package of FIG. 2b, the input/output pin of the first package type is bonded to the input/output connection pad 20 and the input/output connection pad 30 is not bonded to any input/output pin of the first package. Alternately, if the semiconductor substrate is mounted to a second package type such as the TQFP of FIG. 2, an input/output pin of the second package is bonded to the input/output connection pad 30 and the input/output connection pad 20 is not bonded to any input/output pin of the second package.

Figure 7:
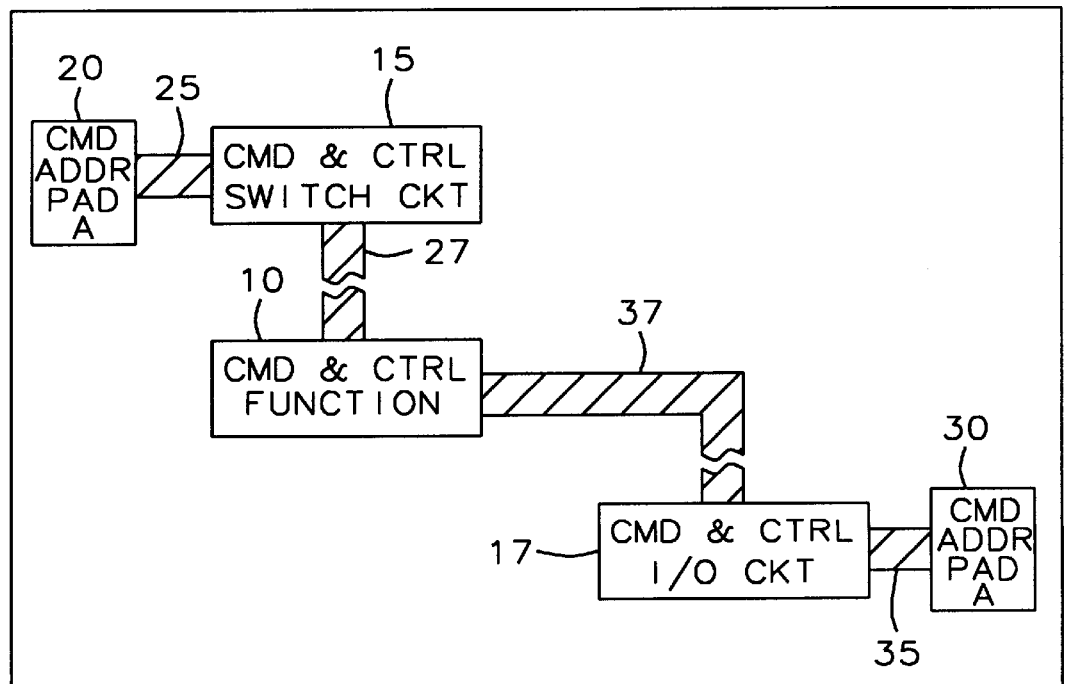
FIG. 7 is a diagram showing a second embodiment of the input/output connection structure of this invention.

The input/output structure of this invention allows the selection of configuration of the integrated circuit chip to be made late in the manufacturing process during the mounting of the semiconductor substrate in a particular package type and the bonding of the input/output connection pads to the input/output pins of the package. Those input/output connection pads not bonded remain floating. As is known in the art, long, floating metal interconnecting lands 25 or 35 and floating input/output connection pads are a source of additional loading capacitance for the input/output circuit 15 and may also be a source of coupled noise. For a discussion of mitigation of this problem, refer to FIG. 7 for an alternate embodiment of this invention. In this embodiment, a command and control input/output circuit 15 and 17 is associated with each command and control input/output connection pad 20 and 30 The command and control input/output circuits 15 and 17 are placed in relatively close proximity of the command and control input/output connection pads 20 and 30 and are respectively connected to the command and control input/output connection pads 20 and 30 by the metal interconnecting lands 25 and 35. The command and control input/output circuits 15 and 17 are connected to the command and control functional circuit 10 respectively by the metal interconnecting lands 27 and 37.

If the semiconductor substrate is mounted to a first package type such as the TSOP of FIG. 1a or the TQFP package of FIG. 2b, the command and control input/output connection pad 20 is bonded to the input/output pins of the first package type. The command and control input/output circuit 15 is activated to transfer the command and control signals between the command and control functional circuit 10 and external circuitry. The input/output connection pad 30 is not bonded to the input/output pins of the first package type and the command and control input/output circuit 17 is not activated. Alternately, if the semiconductor substrate is mounted to a second package type such as the TSOP package of FIG. 1b or TQFP of FIG. 2a, the command and control input/output connection pad 30 is bonded to the input/output pins of the second package type. The command and control input/output circuit 17 is activated to transfer command and control signals between the command and control functional circuit 10 and the external circuitry. The input/output connection pad 20 is not bonded to the input/output pins of the second package type and the command and control input/output circuit 15 is not activated. The structure as shown minimizes the effect of the capacitance of the metal interconnecting lands and, by appropriate grounding, eliminates any sources of coupled noise.

Figure 8:
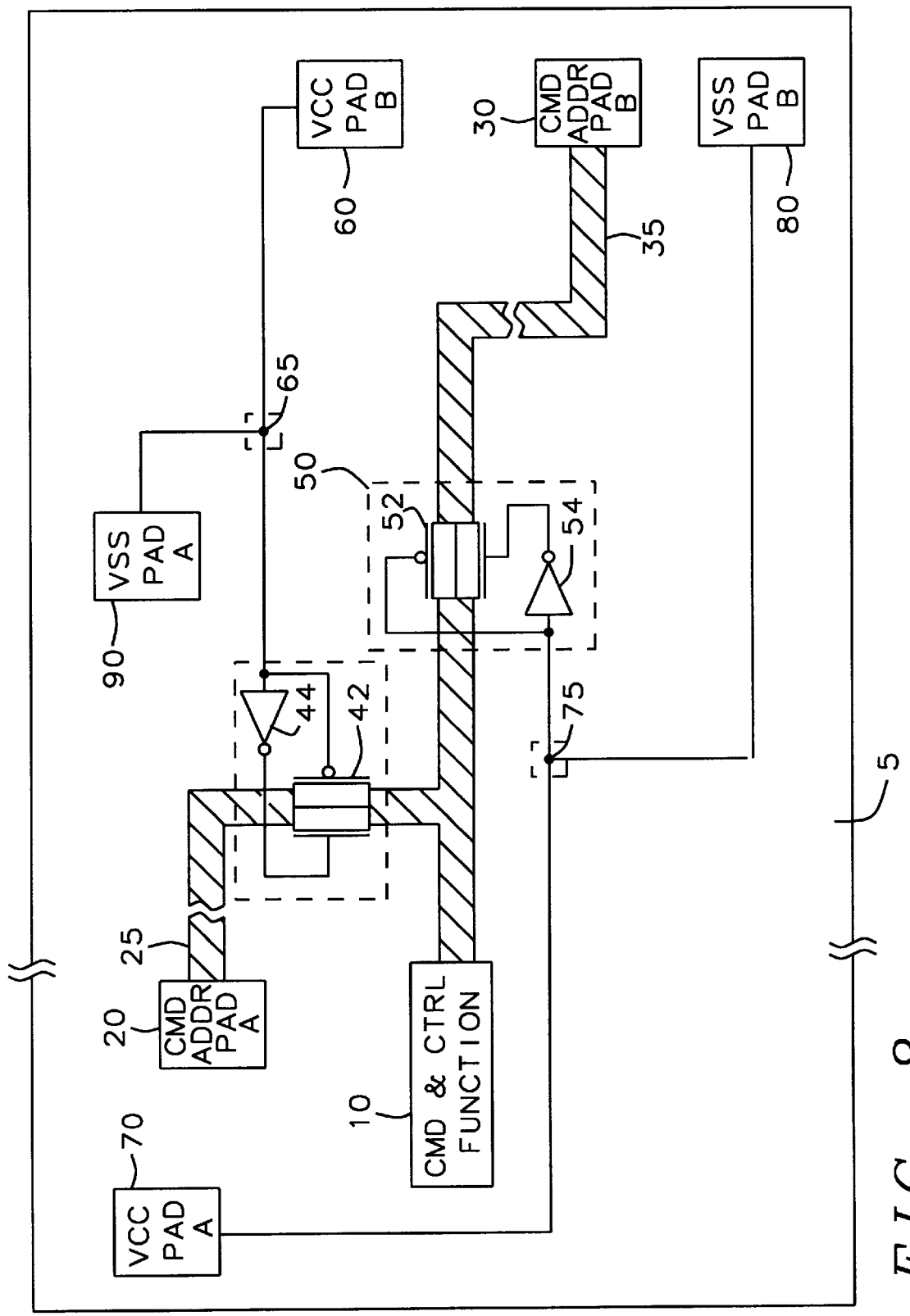
FIG. 8 is a diagram showing a third embodiment of the input/output connection structure of this invention.

FIG. 8 illustrates a third embodiment of this invention to provide multiple package options for a single integrated circuit design formed on a semiconductor substrate. The fundamental structure of this embodiment is as shown in FIG. 5. However, a first switch 40 is placed in the metal interconnecting land 25, between the command and address connection pad 20 and the command and control function 10. A second switch 50 is placed in the metal interconnecting land 35, between the command and address connection pad 30 and the command and control function 10. A control terminal 65 of the switch 40 is connected to a connection pad 60 in the second area B that is to be connected through the pin of the second package type to a power supply voltage source $V_{DD}$. Further, the control terminal 65 of the switch 40 is connected to an connection pad 90 in the first area A that is to be connected through the pins of the first package type to a substrate biasing voltage source $V_{SS}$. Similarly, a control terminal 75 is connected to an connection pad 70 in the first area A that is to be connected through the pins of the first package type to the power supply voltage source $V_{DD}$. The control terminal 75 is also connected to a connection pad 80 in the second area B that is to be connected through the pins of the second package type to the substrate biasing voltage source $V_{SS}$.

The switch 40 is composed of a pass gate transistor 42 and the inverter 44. As structured, if the control gate 65 is a low voltage level approaching a ground reference level, the pass gate transistor 42 is activated. Alternately, if the control gate 65 is a high voltage level approaching the power supply voltage source $V_{DD}$, the pass gate transistor 42 is deactivated.

The switch 50 is similarly composed of a pass gate transistor 52 and an inverter 54. The operation is as described for the switch 40, with the switch control 75 being set near the ground reference potential activating the pass gate transistor 52 and the switch control 75 being set at or near the voltage level of the power supply voltage source $V_{DD}$ deactivating the pass gate transistor 52.

If the semiconductor substrate 5 is mounted to the first package type such as a TSOP package of FIG. 1a or the TQFP package of FIG. 2b, the first switch 40 is activated and the command and control function 10 is connected to the command and control connection pad 20 through the metal interconnecting land 25 thus creating a signal path between the command and control functional circuit 10 and external circuitry. The second switch 50 is deactivated disconnecting the command and control function 10 from the connection pad 30. Alternately, if the semiconductor substrate is mounted in the second package type, such as a TSOP package of FIG. 1b or a TQFP package of FIG. 2a, the second switch 50 is activated and the command and control subcircuit is connected to the command and control connection pad 30 through the metal interconnecting land 35 thus creating a signal path between the command and control functional circuit 10 and external circuitry. The first switch 40 is deactivated thus disconnecting the command and control function 10 from the connection pad 20.

By disconnecting the connection pad 20 or 30 that are not bonded in a chosen package type, the additional loading capacitance and source of coupled noise is eliminated thus improving circuit performance.

An alternative to employing physical switches as shown in FIG. 8 to select the routing of the address, command, and control signals to the command and control input/output pads, is to change the metalization masking during the final metalization step while fabricating the integrated circuit RAM on the semiconductor substrate. Thus the semiconductor substrate has all of the fabrication steps completed with the exception of the final metalization and is maintained in inventory. Once the particular package style (ODIC or non-ODIC) is knovn, the final metalization is completed, the wafer testing is completed, the semiconductor substrate is diced into the individual RAM chips, packaged into the particular package styles (ODIC or non-ODIC), and process through a final test.

While this invention has been particularly shown and described with reference to the preferred embodiments thereof, it will be understood by those skilled in the art that various changes in form and details may be made without departing from the spirit and scope of the invention.

The invention claimed is:

1. An integrated circuit formed on a semiconductor substrate, comprising:
    a first group of input/output connector means placed on the semiconductor substrate and attached to a first functional circuit of said integrated circuit;
    a second group of input/output connector means placed on the semiconductor substrate and attached to a second functional circuit of said integrated circuit;
    at least one additional group of input/output connector means placed on the semiconductor substrate in areas separated from the first and second group of input/output connector means, whereby each input/output connector means of said additional group of input/output connector means is connected to a corresponding input/output connector means of the second group of input/output connector means and thus to the second functional circuit, such that if said semiconductor substrate is mounted in a first package type having pins of a first arrangement, the second group of input/output connector means is bonded to pins of the first arrangement to connect the second functional circuit to an external circuit through said second group of input/output connector means, and if said semiconductor substrate is mounted in a second package type having pins of a second arrangement, one group of input/output connector means is bonded to pins of the second arrangement to connect the second functional circuit to the external circuit through said additional group of input/output connector means.

2. The integrated circuit of claim 1 wherein if the semiconductor substrate is mounted in the first package type, any of the additional groups of input/output connector means are disconnected from the second functional circuit.

3. The integrated circuit of claim 1 wherein if the semiconductor substrate is mounted in the second package type, the second group of input/output connector means are disconnected from the second functional circuit.

4. The integrated circuit of claim 1 wherein the first functional circuit is at least one array of memory cells and the second functional circuit provides address, control, timing, and command signals to the array of memory cells.

5. The integrated circuit of claim 4 wherein the memory cells are selected from a group of memory cells consisting of static random access memory cells, read only memory cells, dynamic random access memory cells, synchronous dynamic random access memory cells, and graphic random access memory cells.

6. The integrated circuit of claim 4 wherein the second group of input/output connector means are placed centrally on said semiconductor substrate to allow connection as outer data inner control on said first package type.

7. The integrated circuit of claim 4 wherein one of the additional groups of input/output connector means are placed in proximity to a peripheral edge of semiconductor substrate to allow connection as non-outer data inner control on said second package type.

8. The integrated circuit of claim 2 further comprising a first group of switching means, whereby each switching means is connected between one additional group of input/output connector means and the second functional circuit and in close proximity to the second functional circuit to disconnect the additional input/output connector means from the second functional circuit.

9. The integrated circuit of claim 3 further comprising a second group of switching means, whereby each switching means is connected between one of the second group of input/output connector means and the second functional circuit and in close proximity to the second functional circuit to disconnect the second input/output connector means from the second functional circuit.

10. The integrated circuit of claim 1 wherein:
   a first group of input/output subcircuits is placed in close proximity to said second group of input/output connector means, whereby each input/output subcircuit is connected to one of the second group of input/output connector means;
   a second group of input/output subcircuits is placed in close proximity to one of said additional group of input/output connector means, whereby each input/output subcircuit is connected to one of the additional group of input/output connector means;
   wherein said first group of input/output subcircuits are activated and said second group of input/output subcircuits are not activated if the semiconductor substrate is mounted in said first package type; and
   wherein the second group of input/output subcircuits activated and said first group of input/output subcircuits are not activated if the semiconductor substrate is mounted in said second package type.

11. A memory integrated circuit formed on a semiconductor substrate, comprising:
   a plurality of data input/output connector means placed on the semiconductor substrate and attached to data input/output circuitry of said memory integrated circuit;
   a first plurality of command and control input/output connector means placed on the semiconductor substrate and connected to command and control circuitry of said memory integrated circuit;
   a second plurality of command and control input/output connector means placed on the semiconductor substrate in an area of said semiconductor substrate separated from the data input/output connector means and from the first command and control input/output connector means and connected to the command and control circuitry hereby each input/output connector means of the second plurality of command and control input/output connector means is connected to a corresponding input/output connector means of the first plurality of command and control input/output connector means, wherein if said semiconductor substrate is mounted to a first package type having pins of a first arrangement, the first plurality of command and control input/output connector means are bonded to pins of the first arrangement to connect the command and control circuitry to the external circuitry through said first plurality of command and control input/output connector means, and wherein if said semiconductor substrate is mounted to a second package type having pins of a second arrangement, the second plurality of command and control input/output connector means are bonded to pins of the second arrangement to connect the command and control circuitry to the external circuitry through said second plurality of command and control input/output connector means.

12. The memory integrated circuit of claim 11 wherein if the semiconductor substrate is mounted to the first package type, the second plurality of command and control input/output connector means are disconnected from the command and control circuitry 13.

13. The memory integrated circuit of claim 11 wherein if the semiconductor substrate is mounted to the second package type, the first plurality of command and control input/output connector means are disconnected from the command and control circuitry.

14. The memory integrated circuit of claim 11 further comprising at least one memory array connected to the data input/output circuitry and the command and control circuitry, whereby the memory array is selected from a group of memory arrays consisting of dynamic random access memory, static random access memory, read only memory, synchronous dynamic random access memory and graphic random access memory.

15. The memory integrated circuit of claim 11 wherein the first plurality of command and control input/output connector means are placed centrally on said semiconductor substrate to allow connection as outer data inner control on said first package type.

16. The integrated memory circuit of claim 11 wherein the second plurality of command and control input/output connector means are placed in proximity to a peripheral edge of said semiconductor substrate to allow connection as non-outer data inner control on said second package type.

17. The memory integrated circuit of claim 12 further comprising:
   a first plurality of switching means, whereby each switching means is connected between one of the second plurality of command and control input/output connector means and the second functional circuit and in close proximity to the command and control circuitry to disconnect the third input/output connector means from the second functional circuit.

18. The memory integrated circuit of claim 12 further comprising:
   a second plurality of switching means, whereby each switching means is connected between one of the first plurality of command and control input/output connector means and the command and control circuitry and in close proximity to the second functional circuit to disconnect the second input/output connector means from the second functional circuit.

19. The memory integrated circuit of claim 11 wherein:
   a first plurality of command and control input/output subcircuits is placed in close proximity to said first plurality of command and control input/output connector means, whereby each command and control input/output subcircuit is connected to one of the second plurality of command and control input/output connector means;
   a second plurality of command and control input/output subcircuits is placed in close proximity to said second plurality of command and control input/output connector means, whereby each command and control input/output subcircuit is connected to one of the third plurality of command and control input/output connector means;
   wherein said first plurality of command and control input/output subcircuits are activated and said second plurality of command and control input/output subcircuits are not activated if the semiconductor substrate is mounted in said first package type; and
   wherein the second plurality of command and control input/output subcircuits activated and said first plurality of command and control input/output subcircuits are not activated if the semiconductor substrate is mounted in said second package type.

20. A method for forming an integrated circuit on a semiconductor substrate comprising the steps of
   forming a first functional circuit on said semiconductor substrate;

forming a first plurality of input/output connector means on said semiconductor substrate;

connecting said first plurality of input/output connector means to the first functional circuit;

forming a second functional circuit on said semiconductor substrate;

forming a second plurality of input/output connector means on said semiconductor substrate;

forming a third plurality of input/output connector means on said semiconductor substrate at a location separate from the first and second plurality of input/output connector means;

attaching each one of the second plurality of input/output connector means and each corresponding one of the third plurality of input/output connector means to the second functional circuit;

mounting said semiconductor substrate to first package type; and bonding the second plurality of input/output connector means to pins of the first package type to connect the second functional circuit to external circuits through said second plurality of in input/output tut connector means, alternately, mounting said semiconductor substrate in a second package type; and bonding the third plurality of input/output connector means to pins of the second package type to connect the second functional circuit to external circuits through said third plurality of input/output connector means.

21. The method of claim 20 wherein if the semiconductor substrate is mounted on the first package type, said method is further comprising the step of disconnecting the third plurality of input/output connector means from the second functional circuit.

22. The method of claim 20 wherein if the semiconductor substrate is mounted on the second package type, said method is further comprising the step of disconnecting the second plurality of input/output connector means from the second functional circuit.

23. The method of claim 20 wherein the first functional circuit is at least one array of memory cells and the second functional circuit provides address, control, timing, and command signals to the array of memory cells.

24. The method claim 23 wherein the memory cells are selected from a group of memory cells consisting of static random access memory cells, read only memory cells, dynamic random access memory cells, synchronous dynamic random access memory cells, and graphic random access memory cells.

25. The method of claim 23 wherein the second plurality of input/output connector means are placed centrally on said semiconductor substrate to allow connection as outer data inner control on said first package type.

26. The method of claim 23 wherein the third plurality of input/output connector means are placed in proximity to a peripheral edge of semiconductor substrate to allow connection as non-outer data inner control on said second package type.

27. The method of claim 23 further comprising the step of placing a first plurality of switching means, whereby each switching means is placed between one of the third plurality of input/output connector means and the second functional circuit to disconnect the third plurality of input/output connector means from the second functional circuit.

28. The method of claim 22 further comprising the step of placing a first plurality of switching means, whereby each switching means is placed between one of the second plurality of input/output connector means and the second functional circuit to disconnect the second plurality of input/output connector means from the second functional circuit.

29. The method of claim 21 further comprising the steps of:

placing a first plurality of input/output subcircuits of the second functional circuit in close proximity to said second plurality of input/output connector means;

connecting each input/output subcircuit of the first plurality of input/output subcircuits to one of the second plurality of input/output connector means;

placing a second plurality of input/output subcircuits of the second functional circuit in close proximity to said third plurality of input/output connector means;

connecting each input/output sub circuit of the second plurality of input/output subcircuits to one of the third plurality of input/output connector means;

activating said first plurality of input/output subcircuits and not activating said second plurality of input/output subcircuits if the semiconductor substrate is mounted to the first package type; and activating said second plurality of input/output subcircuits and not activating said first plurality of input/output subcircuits if the semiconductor substrate is mounted to the second package type.

30. A method for forming an integrated circuit on a semiconductor substrate comprising the steps of:

forming a functional circuit on said semiconductor substrate;

forming a first plurality of input/output connector means on said semiconductor substrate;

forming a second plurality of input/output connector means on said semiconductor substrate at a location separate from the first plurality of input/output connector means;

forming a switching circuit upon said semiconductor substrate; connecting switching circuit to said functional circuit, the first plurality of input/output connector means, and the second plurality of input/output connector means;

if said semiconductor substrate is mounted to a first package type having pins of a first arrangement, activating said switching circuit to connect each one of the first plurality of input/output connector means to the functional circuit, such that the functional circuit is in communication with the pins of the first arrangement; and alternately, if said semiconductor substrate is mounted to a second package type having pins of a second arrangement, activating said switching circuit to connect each one of the second plurality of input/output connector means to the functional circuit, such that the functional circuit is in communication with the pins of the second arrangement.

* * * * *